(12) United States Patent
Hsueh et al.

(10) Patent No.: US 7,952,844 B2
(45) Date of Patent: May 31, 2011

(54) ELECTROSTATIC DISCHARGE IMMUNIZING CIRCUIT WITHOUT AREA PENALTY

(75) Inventors: Kuey-Lung Hsueh, Milpitas, CA (US);
Chien-Kuo Wang, Hsin-Chu (TW);
Yu-Ming Sun, Taoyuan County (TW);
Te-Chang Wu, Hsinchu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 964 days.

(21) Appl. No.: 11/766,065

(22) Filed: Jun. 20, 2007

(65) Prior Publication Data

US 2008/0316661 A1 Dec. 25, 2008

(51) Int. Cl.
*H02H 9/00* (2006.01)
(52) U.S. Cl. .......................................................... 361/56
(58) Field of Classification Search ....................... 361/56
See application file for complete search history.

(56) References Cited

U.S. PATENT DOCUMENTS

| | | | |
|---|---|---|---|
| 4,855,863 A * | 8/1989 | Yoshitake | 361/56 |
| 6,114,903 A * | 9/2000 | Bach | 327/565 |
| 7,115,952 B2 | 10/2006 | Woo | |
| 2005/0078427 A1 | 4/2005 | Castro | |

* cited by examiner

*Primary Examiner* — Jared J Fureman
*Assistant Examiner* — Nicholas Ieva
(74) *Attorney, Agent, or Firm* — Winston Hsu; Scott Margo

(57) ABSTRACT

A chip includes a core circuit, a main electrostatic discharge immunizing circuit, and a secondary electrostatic discharge immunizing circuit. The secondary electrostatic discharge immunizing circuit is disposed beneath a core power ring formed between the core circuit and the main electrostatic discharge immunizing circuit for reaching the aim of protecting the core circuit from damage by electrostatic discharges without area penalty of the chip. Both the main electrostatic discharge immunizing circuit and the secondary electrostatic discharge immunizing circuit include a power clamp and a plurality of current limiters, and keep electrostatic currents from reaching the core circuit with the aid of the power clamp.

9 Claims, 6 Drawing Sheets

ELECTROSTATIC DISCHARGE IMMUNIZING CIRCUIT WITHOUT AREA PENALTY

BACKGROUND OF THE INVENTION

1. Field of the Invention

The present invention relates to an electrostatic discharge immunizing circuit, and more particularly, to an electrostatic discharge immunizing circuit without area penalty.

2. Description of the Prior Art

In a conventional chip, since the size of the chip is small, and both the operating voltage and the operating current are small also, switches of voltage levels of elements of a core circuit, which is responsible for calculations of the chip, have to be extremely precise. However, since the chip is conventionally disposed around electronic devices for reducing the volume of an electronic product, the core circuit in the chip is vulnerable to electrostatic discharges released by the electronic devices, and thus easily leads to miscalculations. For preventing the core circuit from being affected by the electrostatic discharges, an electrostatic discharge immunizing circuit (ESD immunizing circuit) is conventionally disposed in the chip for discharging the released electrostatic discharges by providing discharging paths for the released electrostatic discharges so that the calculations of the core circuit are protected. In principle, the core circuit is disposed at the center of the chip, and the ESD immunizing circuit is disposed at surroundings of the chip in the prior art. Therefore, the ESD immunizing circuit may be as far away from the core circuit as possible for preventing electrostatic discharges from getting close to the core circuit, and for guiding the electrostatic discharges to be discharged. However, when the core circuit is implemented with analog circuits, since the volume of the core circuit is small, the core circuit of the prior art is sensitive to the released electrostatic discharges, analog I/O signals of the core circuit are affected, and erroneous calculations of the chip are thus generated. For neutralizing such defects, there are several chips in the prior art that are provided for completely discharging the released electrostatic discharges by adding additional ESD immunizing circuits around the provided chips. However, these additional ESD immunizing circuits lead to larger area penalties of the provided chip of the prior art so that these additional ESD immunizing circuits are not economical solutions for neutralizing such defects.

SUMMARY OF THE INVENTION

The claimed invention provides an electrostatic discharge immunizing circuit without area penalty. The electrostatic discharge immunizing circuit comprises a core circuit, a main electrostatic discharge immunizing circuit, and at least one secondary electrostatic discharge immunizing circuit. The core circuit is disposed on a chip. The main electrostatic discharge immunizing circuit is disposed on the chip and surrounding the core circuit. The secondary electrostatic discharge immunizing circuit is disposed between the core circuit and the main electrostatic discharge immunizing circuit, and is biased with a first voltage source and a first ground. The secondary electrostatic discharge immunizing circuit comprises a first power clamp, at least one first current limiter, and at least one second current limiter. The first power clamp has a first terminal coupled to the first voltage source, and a second terminal coupled to the first ground. The first current limiter is connected in parallel with each other. The first current limiter has a positive bias terminal coupled to a signal input terminal, and has a negative bias terminal coupled to the first voltage source. The second current limiter is connected in parallel with each other. The second current limiter has a positive bias terminal coupled to the first ground, and has a negative bias terminal coupled to a signal output terminal. The core circuit has a first terminal coupled to the first voltage source, and a second terminal coupled to the first ground.

These and other objectives of the present invention will no doubt become obvious to those of ordinary skill in the art after reading the following detailed description of the preferred embodiment that is illustrated in the various figures and drawings.

DETAILED DESCRIPTION

For neutralizing the defect that the core circuit cannot be completely immune from electrostatic discharges by utilizing ESD immunizing circuits, or the defect that area penalties are caused by adding additional ESD immunizing circuits around the chip in the prior art, an ESD immunizing circuit without area penalty is provided in the present invention.

Figure 1:
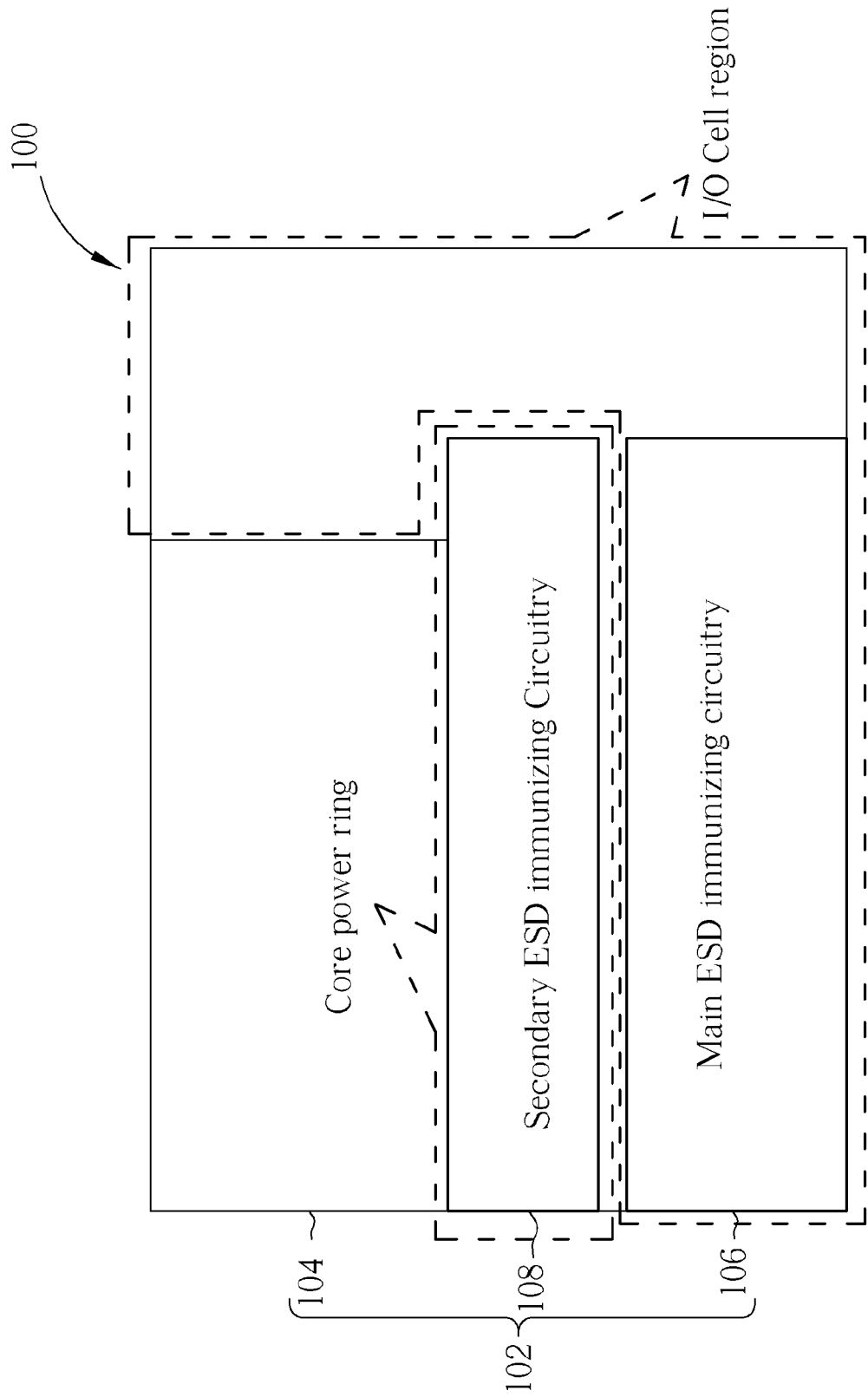
FIG. 1 is a brief diagram illustrating an ESD immunizing circuit disposed on a chip and provided in the present invention.

Please refer to FIG. 1, which is a brief diagram illustrating an ESD immunizing circuit 102 disposed on a chip 100 and provided in the present invention. The ESD immunizing circuit 102 includes a core circuit 104, a main ESD immunizing circuit 106, and a secondary ESD immunizing circuit 108. A core circuit 104 is disposed at the center of the chip 100. Note that as shown in FIG. 1, the chip 100 includes regions covered by the core circuit 104, a core power ring, and an I/O cell region, where the secondary ESD immunizing circuit 108 is covered by the core power ring, and the main ESD immunizing circuit 106 is covered by the I/O cell region. Note that the number of secondary ESD immunizing circuits 106 covered by the core power ring may be more than one, and the number of the main ESD immunizing circuit 106 may be more than one also. However, for simple descriptions hereafter, there are merely one main ESD immunizing circuit 106 and one secondary ESD immunizing circuit 108 illustrated in FIG. 1. Moreover, note that merely part of the chip 100 is illustrated in FIG. 1 so that merely part of the core circuit 104, the core power ring, and the I/O cell region are illustrated in FIG. 1 as well. The main ESD immunizing circuit 106 is disposed surrounding the core circuit 104 on the chip 100. A primary difference between the ESD immunizing circuit 102 and ESD immunizing circuits disclosed in the prior art lies in the secondary ESD immunizing circuit 108. As mentioned above, the core circuit 104 is located at the center of the chip 100, and the main ESD immunizing circuit 106 is located around the core circuit 104 in correspondence to at least one I/O cell in the I/O cell region. The secondary ESD immunizing circuit 108 is disposed at the abovementioned core power ring, which is in fact a circular hollow space formed between the core circuit 104 and the main ESD immunizing circuit 106 on the chip 100. In a chip of the prior art, the core power ring is hollow for stopping electrostatic discharges from reaching the core circuit. However, in the present invention, the originally-existing core power ring is utilized for depositing the secondary ESD immunizing circuit 108 so that the electrostatic discharges in the chip 100 may be discharged completely without area penalty.

Figure 2:
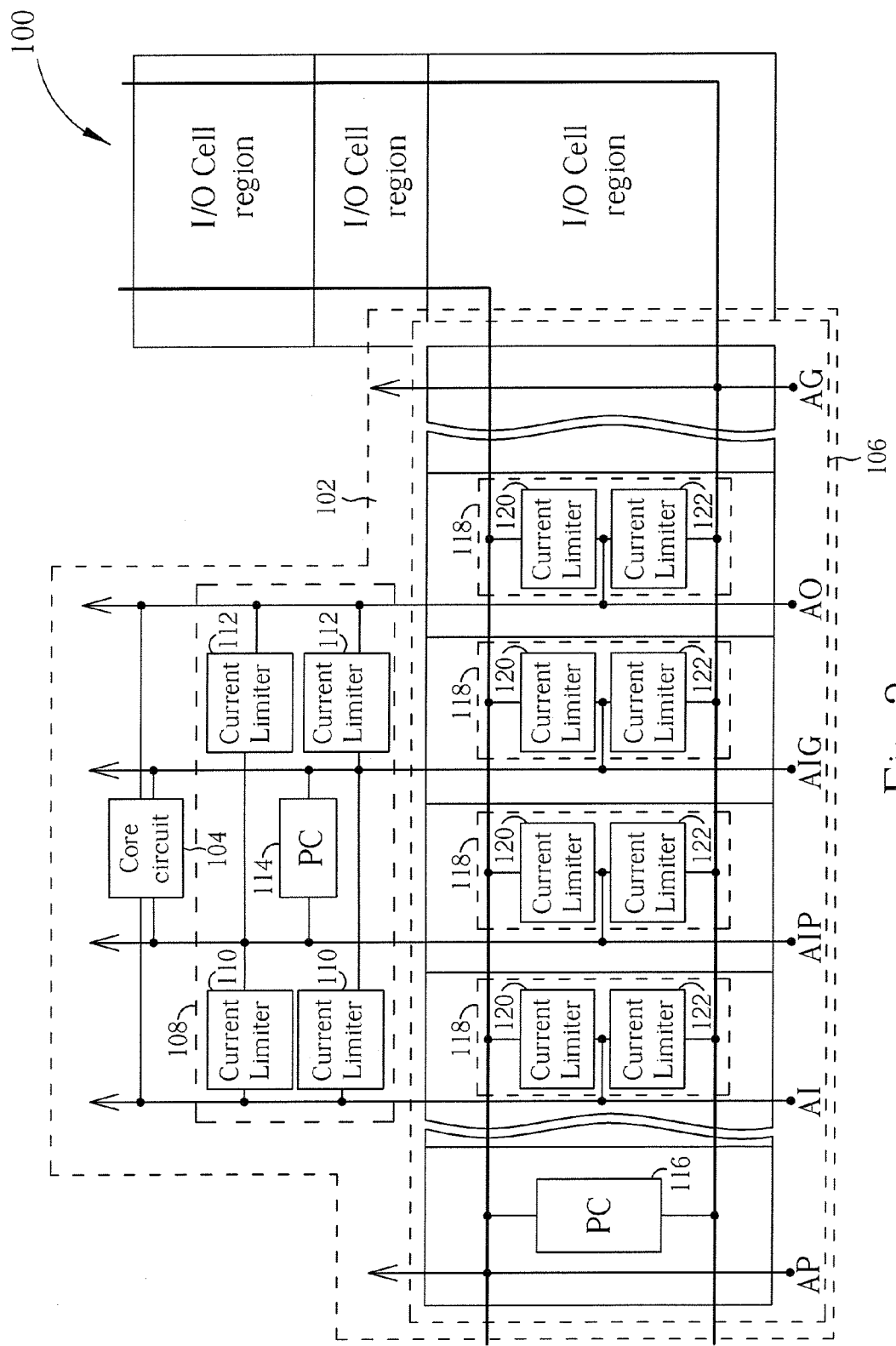
FIG. 2 is a detailed diagram of the ESD immunizing circuit shown in FIG. 1 according to a preferred embodiment of the present invention.

Please refer to FIG. 2 and FIG. 1 together. FIG. 2 is a detailed diagram of the ESD immunizing circuit 102 shown in FIG. 1 according to a preferred embodiment of the present invention. Note that in FIG. 2, the same with FIG. 1, merely part of the chip 100 is illustrated for conveniently describing the ESD immunizing circuit 102 of the present invention. The main ESD immunizing circuit 106 shown in FIG. 2 is still covered by the I/O cell region shown in FIG. 1, however, for simplifying FIG. 2, merely part of the I/O cell region shown in FIG. 1 is illustrated in FIG. 2. The secondary ESD immunizing circuit 108 shown in FIG. 2 is still covered by the core power ring shown in FIG. 1, and similarly, the core power ring is not illustrated in FIG. 2 for simplifying FIG. 2. As shown in FIG. 2, the secondary ESD immunizing circuit 108 includes two first current limiters 110 connected in parallel with each other, two second current limiters 112 connected in parallel with each other, and a first power clamp 114. The main ESD immunizing circuit 106 includes a second power clamp 116, and a plurality of current limiter sets 118 connected in parallel with each other. Each current limiter set 118 includes a third current limiter 120 and a fourth current limiter 122, where the third current limiter 120 and the fourth current limiter 122 in a same current limiter set 118 are connected in parallel with each other. A first voltage source AIP and a first ground AIG are further disposed on the chip 100 for biasing the secondary ESD immunizing circuit 108. In a preferred embodiment of the present invention, the first voltage source AIP is an analog isolation power, and the first ground is an analog isolation ground. A second voltage source AP and a second ground AG are further disposed on the chip 100 for biasing the main ESD immunizing circuit 106. The first voltage source AIP is independent from the second voltage source AP, and the first ground AIP is independent from the second ground AG. In a preferred embodiment of the present invention, the second voltage source AP is an analog power, and the second ground AG is an analog ground. A signal input terminal AI and a signal output terminal AO are further disposed on the chip 100 for inputting or outputting signals processed by the chip 100. In a preferred embodiment of the present invention, the signal input terminal AI is an analog input, and the signal output terminal is an analog output, for inputting or outputting analog signals processed by the chip 100. As shown in FIG. 2, the first power clamp 104 has a first terminal coupled to the first voltage source AIP, and a second terminal coupled to the first ground AIG. The first current limiter 110 has a positive bias terminal coupled to the signal input terminal AI, and a negative bias terminal coupled to the first voltage source AIP. The second current limiter 112 has a positive bias terminal coupled to the first ground AIG, and a negative bias terminal coupled to the signal output terminal AO. The core circuit 104 has a first terminal coupled to the first voltage source AP, and a second terminal coupled to the first ground AIG. The second power clamp 106 has a first terminal coupled to the second voltage source AP, and a second terminal coupled to the second ground AG. The third current limiter 120 has a positive bias terminal coupled to the signal input terminal AI, and a negative bias terminal coupled to the second voltage source AP. The fourth current limiter 122 has a positive bias terminal coupled to the positive bias terminal of the third current limiter 120, and a negative bias terminal coupled to the second ground AG. Therefore in a same current limiter set, the fourth current limiter 122 is connected in parallel with the third current limiter 120. In FIG. 2, there are a first gap between the second voltage source AP and the current limiter sets 118 and a second gap between the second ground AG and the current limiter sets 118, where both the gaps indicate the fact that there are still other current limiter sets 118, which are not illustrated for simplifying FIG. 2, in both the gaps.

Figure 3:
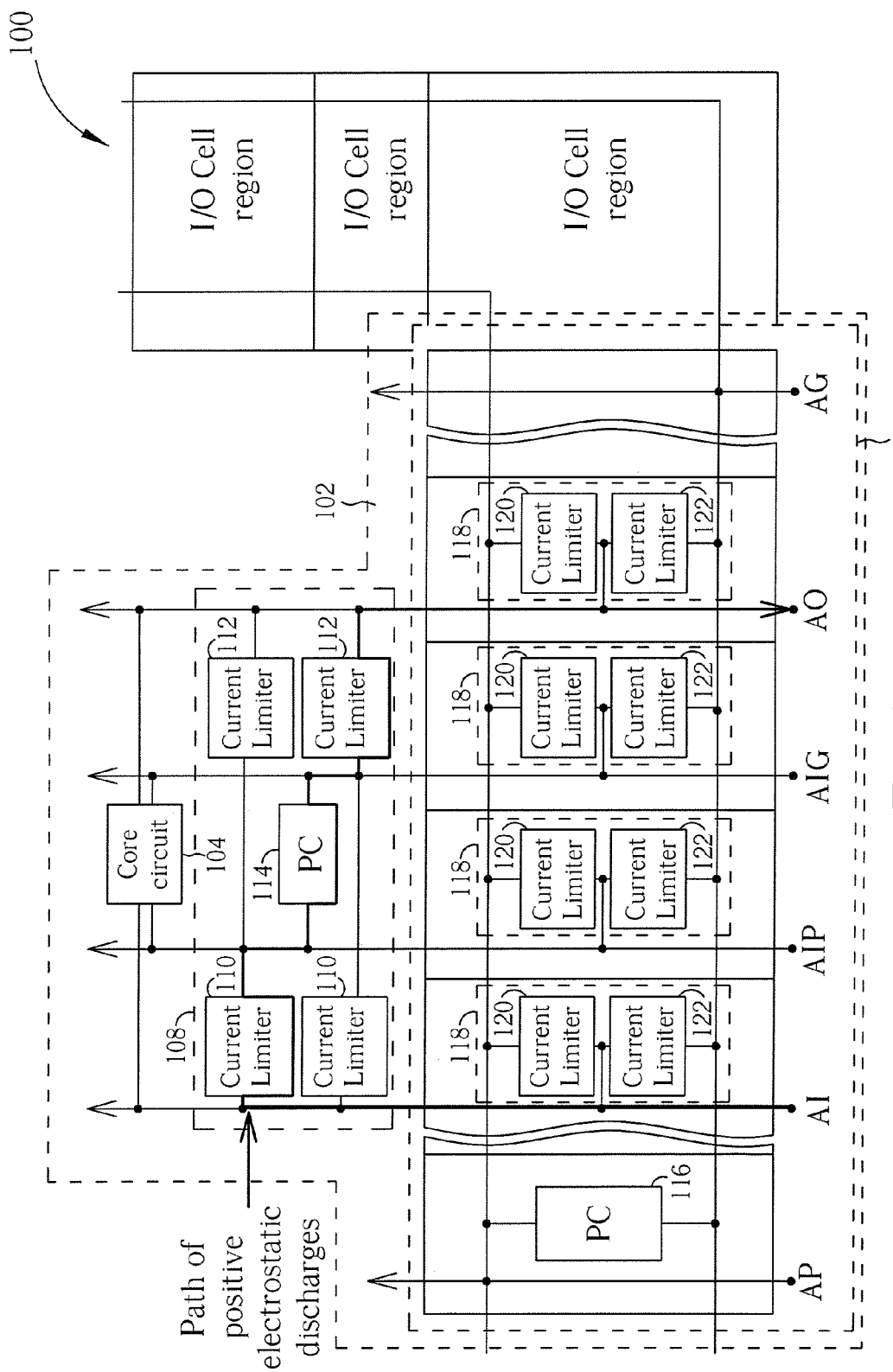
FIG. 3 is a diagram illustrating a path of positive electrostatic discharges flowing through the secondary ESD immunizing circuit of the ESD immunizing circuit shown in FIG. 2.
Figure 4:
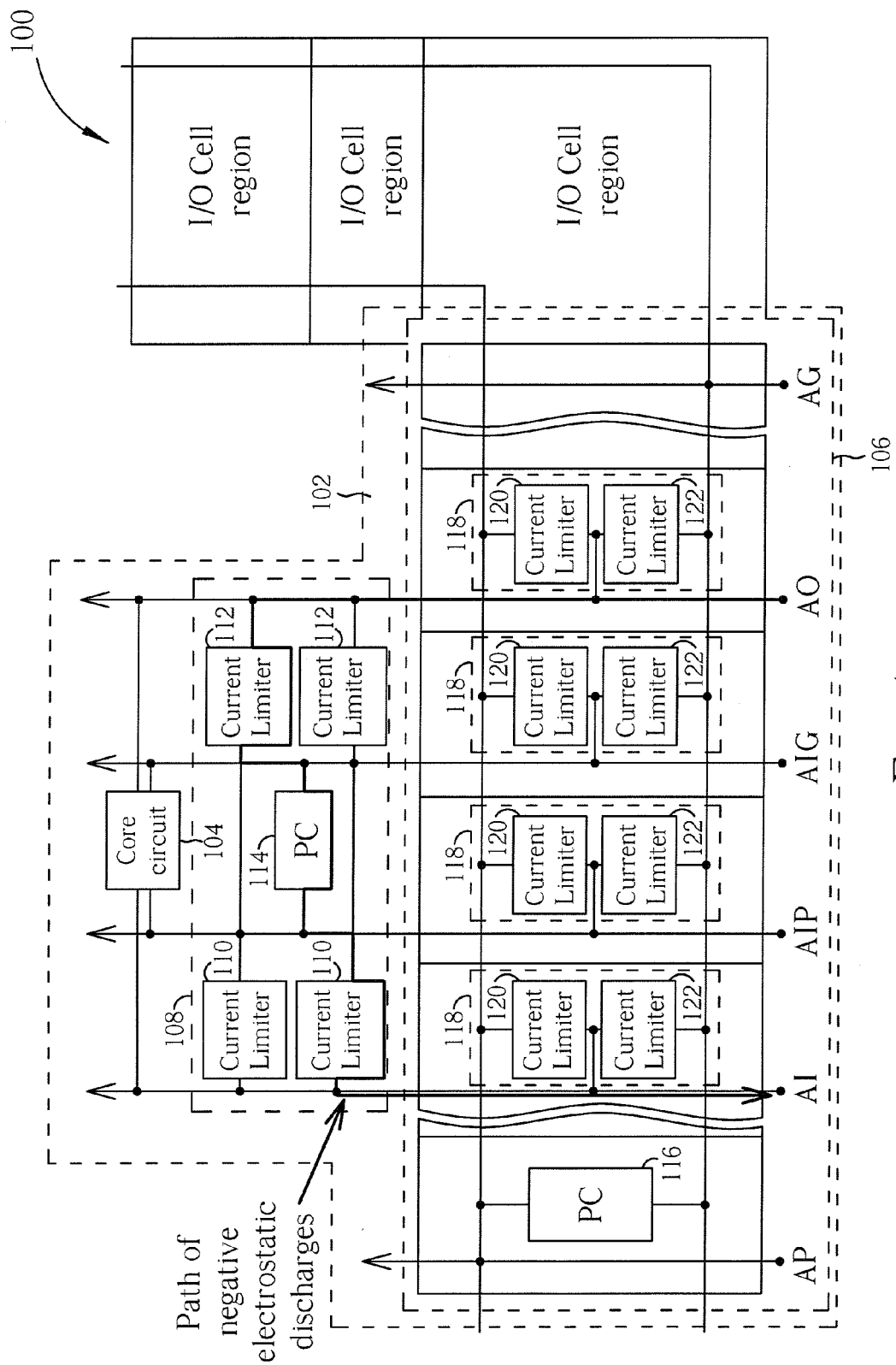
FIG. 4 is a diagram illustrating a path of negative electrostatic discharges flowing through the secondary ESD immunizing circuit of the ESD immunizing circuit shown in FIG. 2.
Figure 5:
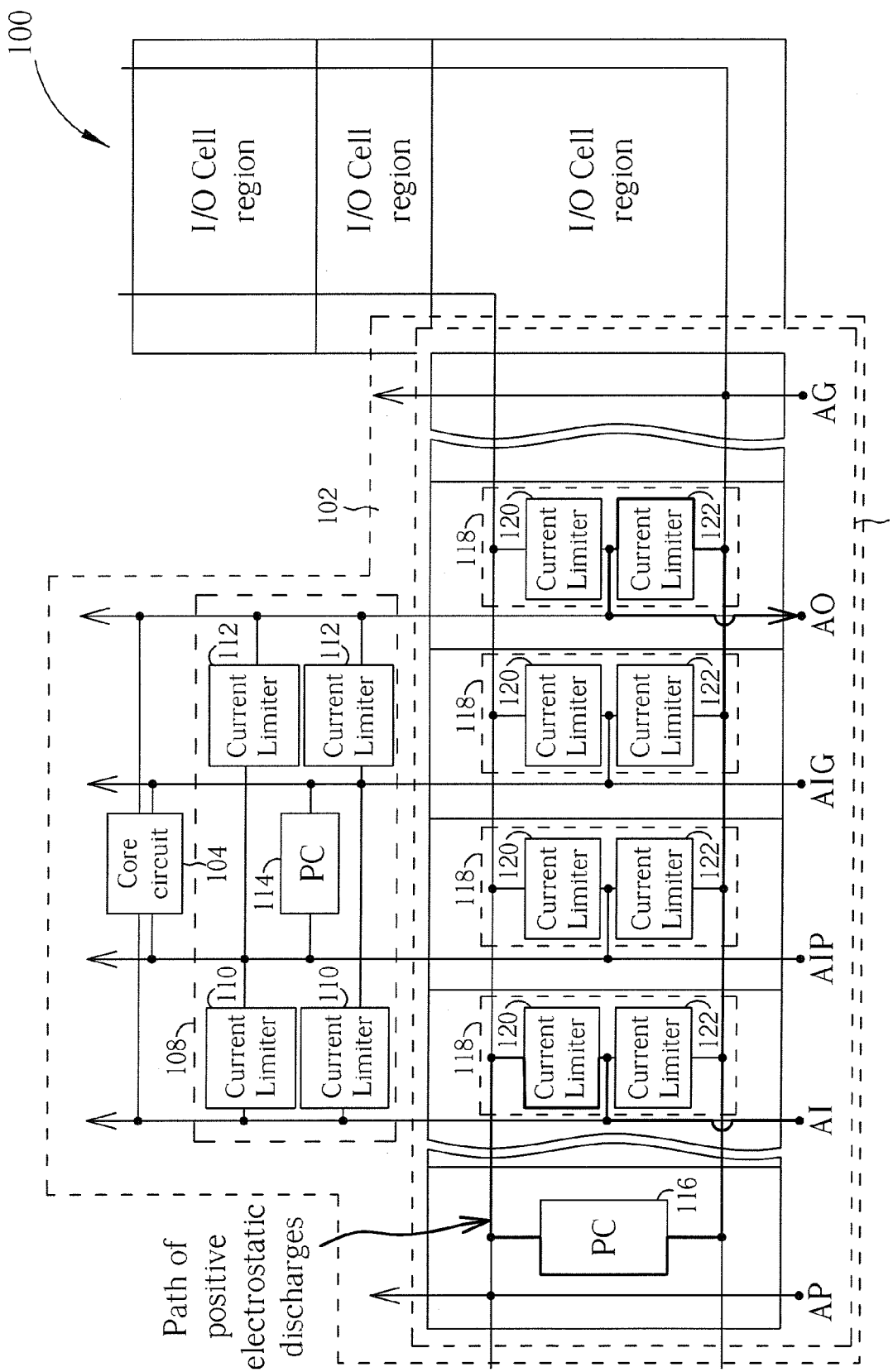
FIG. 5 is a diagram illustrating a path of positive electrostatic discharges flowing through the main ESD immunizing circuit of the ESD immunizing circuit shown in FIG. 2.
Figure 6:
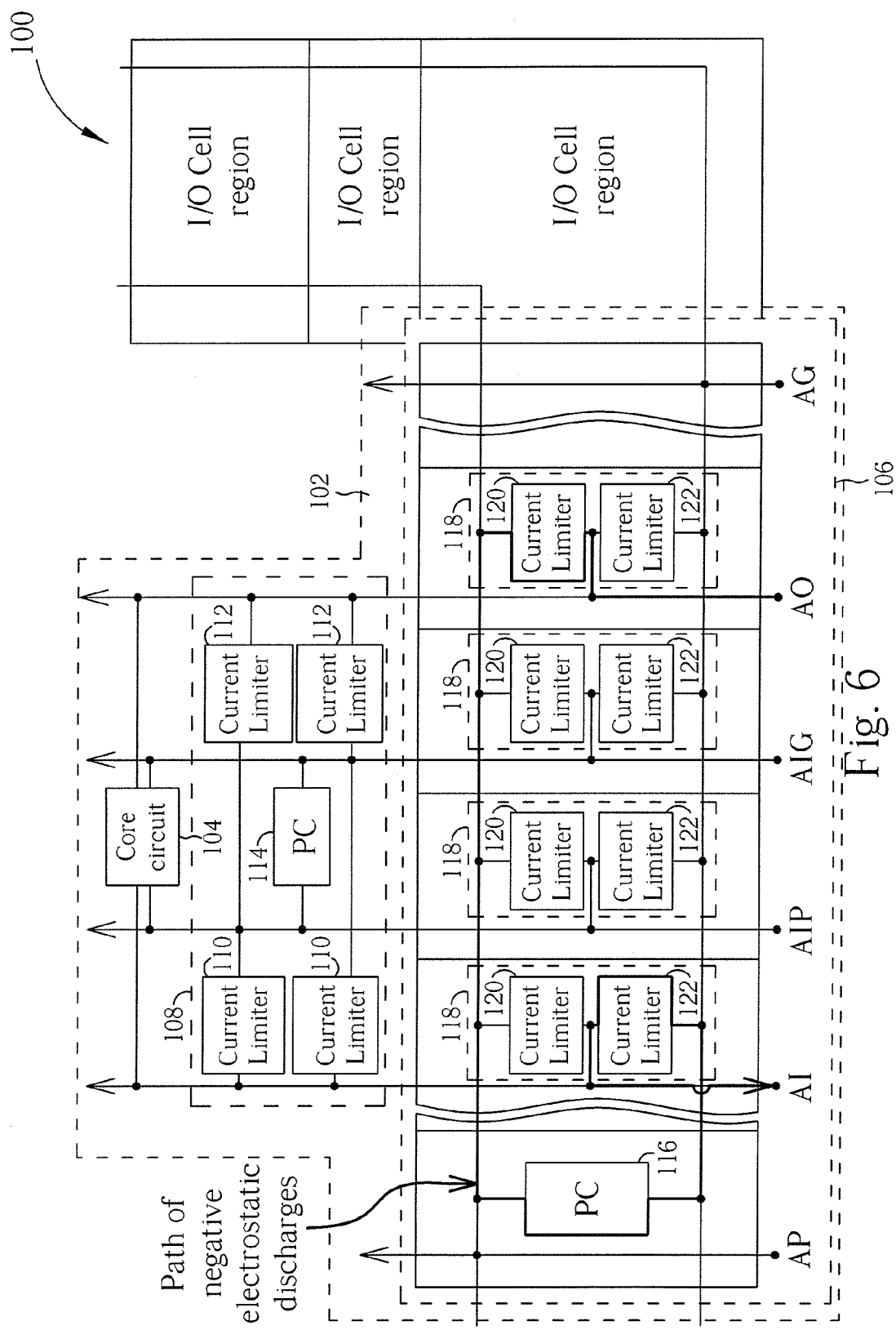
FIG. 6 is a diagram illustrating a path of negative electrostatic discharges flowing through the main ESD immunizing circuit of the ESD immunizing circuit shown in FIG. 2.

Please refer to FIG. 3, FIG. 4, FIG. 5, and FIG. 6. FIG. 3 is a diagram illustrating a path of positive electrostatic discharges flowing through the secondary ESD immunizing circuit 108 of the ESD immunizing circuit 102 shown in FIG. 2. FIG. 4 is a diagram illustrating a path of negative electrostatic discharges flowing through the secondary ESD immunizing circuit 108 of the ESD immunizing circuit 102 shown in FIG. 2. FIG. 5 is a diagram illustrating a path of positive electrostatic discharges flowing through the main ESD immunizing circuit 106 of the ESD immunizing circuit 102 shown in FIG. 2. FIG. 6 is a diagram illustrating a path of negative electrostatic discharges flowing through the main ESD immunizing circuit 106 of the ESD immunizing circuit 102 shown in FIG. 2. As shown in FIG. 3, an electrostatic current bringing positive electrostatic discharges flows from the signal input terminal AI to the signal output terminal AO through one first current limiter 110, the first power clamp 114, and one second current limiter 112 in turn. In the abovementioned electrostatic current path, the first power clamp 114 plays a most important role, since when an electrostatic current bringing positive electrostatic discharges flows through an arbitrary first current limiter 110, the electrostatic current has to be guided by the first power clamp 114 from flowing through the core circuit 104. The fact is accomplished by properties of a conventional power clamp so as not to be described further. Similarly, as shown in FIG. 4, an electrostatic current bringing negative electrostatic discharges flows from the signal output AO to the signal input terminal AI through one second current limiter 112, the first power clamp 114, and one first current limiter 110 in turn, where the electrostatic current is guided by the first power clamp 114 for not reaching the core circuit 104. In FIG. 5, an electrostatic current bringing positive electrostatic discharges flows from the signal input AI to the signal output terminal AO through one current limiter 120, the second power clamp 116, and one fourth current limiter 122 in turn. In FIG. 6, an electrostatic current bringing negative electrostatic discharges flows from the signal output terminal AO to the signal input terminal AI through one third current limiter 120, the power clamp 116, and one fourth current limiter 122 in turn. Paths of electrostatic discharge currents flowing through the main ESD immunizing circuit 106 are guided by the second power clamp 116 so as not to reach the core circuit 104, where the reason is similar with the first power clamp 114 so as not to be described further.

Note that the abovementioned current limiters may be implemented with diodes or transistors. Numbers of both the first current limiter 110 and the second current limiter 112 are not limited to 2 as shown in the abovementioned diagrams. A number of the current limiter sets 118 in the main ESD immunizing circuit 106 is not limited to 4 as shown in the abovementioned diagrams since there may be at least one signal input terminal AI, at least one signal output terminal AO, at least one first voltage source AIP, and at least one first ground AIG in the chip 100, and it also indicates the reason why merely part of the chip 100 are illustrated in the abovementioned diagrams. In other words, any changes in numbers of the abovementioned elements should not be limitations to the present invention. Besides, any changes in numbers of the core circuit 104, the current limiter set 118 in a main ESD immunizing circuit 106, and the secondary ESD immunizing circuit 108 should not be limitations to the present invention either.

Note that although in preferred embodiments of the present invention both the signal input terminal AI and the signal output terminal AO are an analog input and an analog output respectively, both the signal input terminal AI and the signal output terminal AO may still be a digital input and a digital output respectively, and the aim of preventing the core circuit from being affected by electrostatic discharges without area penalties may still be achieved in the present invention. Similarly, in FIG. 2, the first voltage source AIP may be implemented with a digital isolation power, the first ground AIG may still be implemented with a digital isolation ground, the second voltage source AP may still be implemented with a digital power, and the second ground AG may still be a digital ground as well.

In the present invention, an ESD immunizing circuit is provided. By disposing a secondary ESD immunizing circuit in a core power ring formed in a chip, the ESD immunizing circuit provided in the present invention may enhance the discharging of electrostatic discharges of the main ESD immunizing circuit without area penalty in comparison to the prior art, and the core circuit may be better protected from being affected by electrostatic discharges.

Those skilled in the art will readily observe that numerous modifications and alterations of the device and method may be made while retaining the teachings of the invention.

What is claimed is:

1. An electrostatic discharge immunizing circuit without area penalty comprising:
    at least one secondary electrostatic discharge immunizing circuit disposed under a core power ring formed between a core circuit and a main electrostatic discharge immunizing circuit, the secondary electrostatic discharge immunizing circuit comprising:
        a first power clamp having a first terminal coupled to a first voltage source, and a second terminal coupled to a first ground;
        at least one first current limiter connected in parallel with each other, wherein the current limiter has a positive bias terminal coupled to a signal input terminal, and has a negative bias terminal coupled to the first voltage source; and
        at least one second current limiter connected in parallel with each other, wherein the second current limiter has a positive bias terminal coupled to the first ground, and has a negative bias terminal coupled to a signal output terminal;
    wherein the core circuit has a first terminal coupled to the first voltage source and a second terminal coupled to the first ground.

2. The electrostatic discharge immunizing circuit of claim 1 wherein the main electrostatic discharge immunizing circuit is biased with a second voltage source and a second ground, wherein the first voltage source is independent from the second voltage source, and the first ground is independent from the second ground.

3. The electrostatic discharge immunizing circuit of claim 2 wherein the both the first current limiter and the second current limiter are diodes.

4. The electrostatic discharge immunizing circuit of claim 2 wherein the both the first current limiter and the second current limiter are transistors.

5. The electrostatic discharge immunizing circuit of claim 3 wherein the main electrostatic discharge immunizing circuit comprises:
    a second power clamp having a first terminal coupled to the second voltage source and a second terminal coupled to the second ground; and
    a plurality of current limiter sets connected in parallel with each other, wherein each of the plurality of current limiter sets comprises:
        a third current limiter having a positive bias terminal coupled to the signal input terminal and a negative bias terminal coupled to the second voltage source; and
        a fourth current limiter having a positive bias terminal coupled to the positive bias terminal of the third current limiter and a negative bias terminal coupled to the second ground.

6. The electrostatic discharge immunizing circuit of claim 5 wherein both the third current limiter and the fourth current limiter are diodes.

7. The electrostatic discharge immunizing circuit of claim 5 wherein both the third current limiter and the fourth current limiter are transistors.

8. The electrostatic discharge immunizing circuit of claim 1 further comprising:
    the core circuit disposed on a chip; and
    the main electrostatic discharging immunizing circuit disposed on the chip and surrounding the core circuit.

9. The electrostatic discharge immunizing circuit of claim 1, wherein the at least one secondary electrostatic discharge immunizing circuit is biased with the first voltage source and the first ground.

* * * * *